(12) United States Patent
Luettgens et al.

(10) Patent No.: US 8,465,183 B2
(45) Date of Patent: Jun. 18, 2013

(54) LIGHTING DEVICE AND METHOD FOR MANUFACTURING SAME

(75) Inventors: Gunnar Luettgens, Aachen (DE); Benno Spinger, Aachen (DE); Egbert Lenderink, Eindhoven (NL); Daniël Anton Benoy, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 864 days.

(21) Appl. No.: 12/097,081

(22) PCT Filed: Dec. 4, 2006

(86) PCT No.: PCT/IB2006/054569
§ 371 (c)(1),
(2), (4) Date: Nov. 17, 2009

(87) PCT Pub. No.: WO2007/069119
PCT Pub. Date: Jun. 21, 2007

(65) Prior Publication Data
US 2010/0265717 A1    Oct. 21, 2010

(30) Foreign Application Priority Data
Dec. 14, 2005  (EP) .................................. 05112162

(51) Int. Cl.
*B60Q 1/06* (2006.01)
(52) U.S. Cl.
USPC .......................................... 362/373; 362/294
(58) Field of Classification Search
USPC ..... 313/498; 257/98–100; 361/699; 362/373, 362/294
See application file for complete search history.

(56) References Cited

U.S. PATENT DOCUMENTS

| 4,847,731 A | 7/1989 | Smolley |
| 6,799,864 B2 * | 10/2004 | Bohler et al. ................. 362/236 |
| 7,281,807 B2 * | 10/2007 | Plut ............................... 353/119 |
| 2005/0084229 A1 | 4/2005 | Babbitt et al. |
| 2005/0092469 A1 | 5/2005 | Huang |
| 2005/0190562 A1 * | 9/2005 | Keuper et al. ................. 362/325 |

FOREIGN PATENT DOCUMENTS

| DE | EP1225643 A1 | 7/2002 |
| DE | 10213042 A1 | 10/2003 |
| DE | 102005013208 A1 | 10/2005 |
| EP | 0144071 A2 | 6/1985 |
| JP | 60158649 A | 8/1985 |
| WO | WO9916136 A1 | 4/1999 |
| WO | WO02052656 A1 | 7/2002 |
| WO | 2004011848 A2 | 5/2004 |
| WO | WO2004038759 A2 | 5/2004 |

OTHER PUBLICATIONS

English Translation of DE102005013208, published Oct. 27, 2005.*
Zukauskas et al: "Introduction to Solid State Lighting"; Wiley Publishing, 2002, Chapter 7.

* cited by examiner

*Primary Examiner* — Mary Ellen Bowman

(57) ABSTRACT

A lighting device (1) comprising an LED-unit (5), a collimator (2) and a housing (3), the LED-unit (5) is rigidly coupled to the collimator (2) only, so that no substantial forces can be applied to the LED-unit (5). A non-rigid heat transferring medium (10) is provided in a cavity (12) in the housing (3), to dissipate heat, generated by the LED-unit (5). The LED-unit (5) is therefore at least partly contained in the heat transferring medium (10).

20 Claims, 5 Drawing Sheets

LIGHTING DEVICE AND METHOD FOR MANUFACTURING SAME

Figure 1:
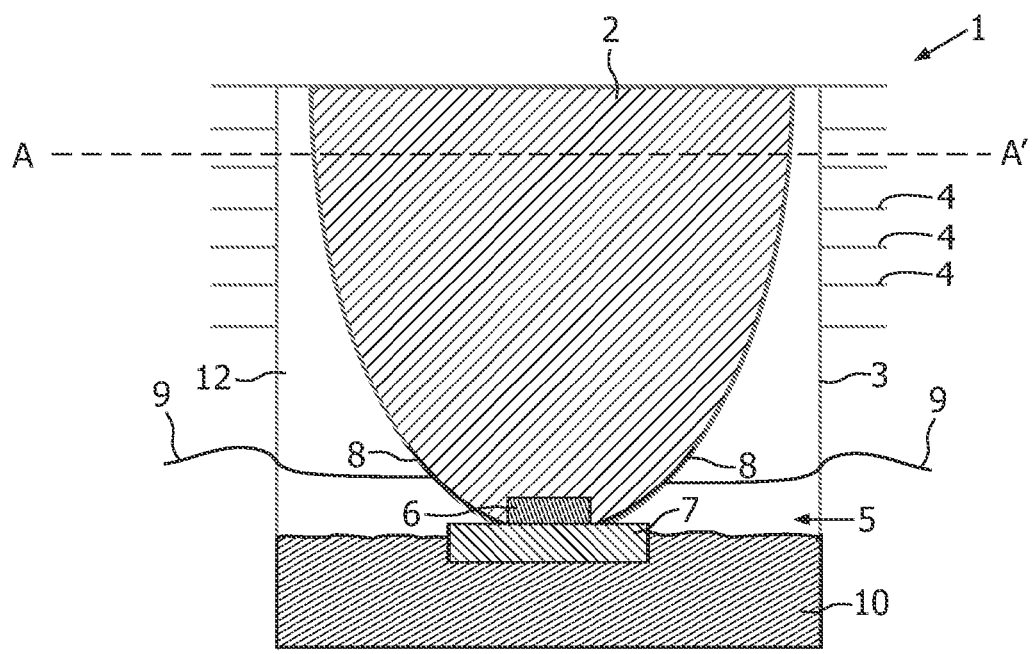

The invention relates to a lighting device and method for manufacturing such a device.

Recently, semiconductor light-emitting devices, such as LEDs are being used for automotive and general lighting applications. Recent development of so-called "high power" LEDs, which exhibit a very high luminous flux, enable the use of a single LED instead of a common lightbulb for lighting applications.

On one hand, due to the high luminous flux, the corresponding high power consumption of these devices (>1 W) and the small form-factor, heat generated by the device has to be dissipated properly, because the efficacy of an LED is highly affected at high temperatures. On the other hand, an optical system, like a collimator or a reflector is used in many applications to direct the light, as required by the specific application, for example in an automotive headlight. In the prior art, this problem is usually addressed by an arrangement of the LED between a rigid heat sink and a reflector. However, due to the rigid mounting of the LED between two elements, forces are applied to the LED, which may damage the light-emitting device, especially in automotive applications.

A solution to this problem is disclosed in WO-A-2004/038759. As can be seen from FIG. 11, an LED 10 is mounted on top of a heat-pipe 64, which is used for dissipating heat generated in the LED 10. A TIR (total internal reflection) reflector 10b is arranged on top, but without contact to the LED 10, forming a concave space between the two elements. The concave space between the TIR reflector 10b and the LED 10 is filled with an index-matching fluid.

However a lighting device of this type, may have a limited lifetime due to the problem of different thermal expansion coefficients of the index-matching fluid, the LED and the TIR reflector, which may cause the device to break at high temperatures. Furthermore the index-matching fluid of the prior-art device causes degradation problems and the filling process makes the manufacturing of the device difficult.

Accordingly, the object of this invention is to provide a lighting device, which shows an enhanced mechanical support, while maintaining a good heat dissipation.

The lighting device according to the invention comprises at least one LED-unit and may comprise a plurality of LED-units. The LED-unit includes at least one semiconductor light-emitting device (LED), preferably a high power LED made for lighting purposes. Alternatively, a plurality of LEDs may be used in a single LED-unit, for example in form of an array on a single LED-die or a plurality of LED-dice, to achieve a high luminous flux. Furthermore the LED-unit may comprise driver circuits or other electronic or mechanical components like leads for supplying the LED with electrical energy, a mount for supporting the LED or means for heat dissipation. The LED-unit is rigidly coupled to a collimator only. The term "rigidly coupled" includes, by means of the present invention, any type of connection or fixation, which enables to apply forces, for example in the form of vibrations, to the LED-unit. The rigid coupling to the collimator only, i.e. that the LED-unit is rigidly connected to a single component or point only, is advantageous, because no substantial forces, which occur for example in automobile applications due to vibrations, can be applied to the LED-unit. Substantial forces are understood to include forces, able to damage the LED-unit or any component of the LED-unit, for example in terms of a forced rupture or fracture by vibration. The collimator may be of any suitable type. For example, a GRIN lens (gradient index lens), made from ion-exchanged glass material, may be used. Generally, the collimator may be made from any suitable material, for example plastics or glass. In the present context, the term "collimator" is understood to include also reflectors of any suitable type. The collimator is mounted at least partly in a housing, which can be made of any suitable material, able to provide sufficient stability to sustain the collimator. For example, a metal or plastic material is used. It is preferred, that the housing is able to dissipate heat, generated by the LED, either by being made of a heat conducting material or by suitable structural means, such as cooling fins. It is possible to arrange a plurality of collimators with separate LED-units or a common LED-unit in a single housing.

According to the invention, the housing comprises a cavity, in which a non-rigid heat transferring medium is contained. The cavity may be of any shape and volume and is dimensioned in dependence of the heat transferring medium, so that the LED-unit is at least partly contained in the medium. Therefore, the collimator shall be mounted to the housing accordingly. Generally, a good thermal contact between the LED-unit and the heat transferring medium is desirable. The cavity is preferably completely sealed, so that the heat transferring medium is retained in the cavity for the life-time of the light emitting device.

The non-rigid heat transferring medium may be of any type, which is thermoconducting, so as to dissipate heat, generated in the LED-unit. The term "non-rigid" is understood to include all materials, which do not form a stiff connection to the LED-unit, i.e. that the medium does not transmit substantial forces to the LED-unit. The basic idea is, as stated above, that the LED-unit is rigidly connected to the collimator only, i.e. to a single component, so that no substantial forces are applied to the LED-unit, which may otherwise damage the LED-unit.

In a preferred embodiment, the collimator is a TIR (total internal reflection) collimator, also referred to as TIR reflector. TIR collimators enable good collimation-properties and provide a high optical efficacy. In comparison to standard reflectors, which usually exhibit an efficacy of 50%, TIR collimators provide an efficacy of >90%. Generally, the TIR collimator can be made from any suitable material, depending on the wavelength range used. Suitable materials are, by way of example, glass or transparent ceramic material. In terms of ease of manufacturing, it is especially preferred, that the TIR collimator is made from transparent plastics. Suitable plastic materials include PMMA (polymethyl metacrylate), polycarbonate or COC (cyclic olefin copolymer). The TIR collimator may be partly coated with a reflective coating in the desired wavelength range or a cladding to support the total internal reflection, depending on application, to further enhance the optical efficacy. The reflective coating may be especially applied to the part of the TIR collimator, where the LED-unit is mounted, since in that area, it can be difficult to achieve total internal reflection, due to the angle of incident light on these surfaces.

It is preferred, that the LED-unit is coupled to the collimator by means of inorganic glue, glass frits or especially preferred by injection moulding. The collimator therefore should provide a suitable retainer, which may be for example a recess, formed in the collimator. When using inorganic glue, which is applied between LED-unit and collimator, i.e. in the optical path, the glue should preferably meet the reflective index of the collimator. The use of glass frites is preferred in case the collimator is made of glass. Here, a fluid glass frite having the refractive-index of the collimator is used to connect the LED-unit to the collimator by means of heat and pressure.

The LED-unit may also be coupled to the collimator by means of injection moulding. This coupling is preferred in the case the collimator is made from plastic material, for example, when a TIR collimator is used. Injection moulding is especially advantageous, because a direct contact of the surface of the LED-die with the collimator can be achieved, so that losses, due to an abrupt change in the refractive index can be avoided. A particular high efficacy can thus be achieved due to the combination of the total internal reflection properties of the collimator together with reduced reflection losses, because of the direct contact of the LED with the TIR collimator. The TIR collimator can be injection-moulded directly on the LED-unit, which enables an easy and cost-efficient manufacturing process.

According to a development of the invention, the heat transferring medium is gel-like or especially preferred liquid. The heat transferring medium should generally enable a sufficient heat conduction between the LED-unit and the surrounding housing. Since the heat transferring medium should further be non-rigid, a gel-like or liquid medium is especially advantageous. Examples of suitable materials are water, mineral or synthetic oils The heat transferring medium can also be a combination of the above-mentioned types with structures, which support the heat transferring properties, for example a porous, fibrous structure in which a gel-like or liquid medium is present. It is most preferred, that the heat transferring medium is liquid. Liquids generally exhibit a high density and thus good thermal conduction properties. Further, liquids generally provide an excellent thermal contact between the LED-unit and the housing. It is ally provide an excellent thermal contact between the LED-unit and the housing. It is especially preferred, that the LED-unit is immersed in the liquid.

The type of the heat-transporting mechanism can be either a convection-type or a heat-pipe mechanism. For a convection-type mechanism, suitable liquids should have a boiling point above the operating temperature of in the LED-unit, so that the liquid medium does not evaporate completely, which would hinder the heat dissipation. Generally, the liquid should further have electrical isolating-properties, when the LED itself or any electronic component of the LED-unit is in direct contact with the fluid. However, a conducting fluid may be used as a connection to the power supply, provided that the LED-unit is designed accordingly. When a TIR collimator is used and the liquid is in direct contact with the TIR collimator, it may be necessary to coat the exposed surfaces of the TIR collimator with a cladding or coating to maintain total internal reflection properties. The necessity of a cladding of naturally depends on the difference in the refractive indices of the TIR collimator and the used fluid.

Alternatively, the heat transferring medium can be a heat-pipe-fluid. Heat-pipe-fluids are able to transport heat efficiently. In a heat-pipe mechanism, fluid heat-pipe medium is arranged in a sealed cavity in close contact to a heat source. Due to the heat produced at the heat source, parts of the heat-pipe-fluid are evaporated. The vapor then condenses at a colder heat-sink of the cavity and may then flow back to the heat source. Here, the heat-pipe-fluid is evaporated by the heat generated in the LED-unit. Accordingly, the vapor condenses at the cold wall of the cavity, which serves as a heat sink, and then flows back to the LED-unit. The cavity therefore has to be designed in a way that an unhindered flow-back of the heat-pipe-fluid and thus a circular flow is possible. For example, the inner walls of the cavity may be designed, so that a flow-back is possible by gravity only. Since this is normally dependent on the mounting position, fibrous, porous or wick-like structures may preferably be used inside the cavity to promote the flow-back of the heat-pipe-fluid by capillary forces so that a circular flow of heat-pipe fluid can be maintained, even when the flow-back is directed against gravity. Particular preferably, the inner walls of the cavity include capillary or arterial-like structures to promote a circular flow of the heat-pipe fluid. To obtain a sufficient vaporisation of heat-pipe fluid and thus heat dissipation from the LED-unit, the LED-unit may not be fully surrounded by porous material.

Examples of suitable heat-pipe fluids are ammonia, methanol, PP2, ethanol, water or solutions and mixtures of these. Generally, a suitable heat-pipe fluid should allow operation in a temperature range dictated by the temperature requirements of the LED source as well as the temperature conditions of the application. This will in most cases mean an operating temperature in the range between 25° C. and 100° C.

In another preferred embodiment, the cavity of the housing is dimensioned so that the LED-unit is at least partly contained in the liquid transferring medium, independent of the mounting position of the lighting device. This configuration allows a universal operating position of the lighting device, which provides a higher flexibility of use. The cavity of the housing shall therefore be dimensioned or structured in dependence to the amount and viscosity of the heat transferring medium, so that a sufficient thermal contact between the LED-unit and the heat transferring medium is always maintained.

According to a further development of the invention, the LED-unit comprises a heat spreader. The heat spreader advantageously enhances the thermal contact and thus the heat dissipation from the LED-unit to the heat transferring medium. The heat spreader may be a small mount, on which the LED is mounted and is generally made of a heat conduction material, for example DBC (direct bonded copper), ceramics, silicon or metal material. It is further possible to arrange a submount between LED and heat spreader, for example made from ceramic or silicon material. The heat spreader shall be as light as possible, so as to minimise the force applied to the LED-unit by gravity. Most preferably, the heat spreader is coupled to the collimator.

In a further preferred embodiment, the surface of the collimator comprises at least one conductive layer connected to the LED-unit, designed to connect the LED-unit to a power supply. A conductive layer may be applied to the collimator using CVD or PVD methods, for example by plasma sputtering, and may cover at least parts of the surface of the collimator. Suitable materials include aluminium, copper or silver. In the case, that the heat transferring medium is conductive or more than one conductive layer is formed, an isolating coating may be applied to the conductive layer, for example an isolating lacquer. The conductive layer may further serve as reflective layer or cladding, as before-mentioned. Conductive layers enable various possibilities for connecting the power supply to the LED-unit. For example, the conductive layer may connect the positive terminal of the power supply to the LED-unit, while a conductive heat transferring medium connects the ground terminal of the power supply to the LED-unit. Further, it is possible to form two conductive layers, isolated from each other on the collimator, for connecting the LED-unit with the power supply. It may also be possible to arrange a structured layer on the collimator, which is able to connect both terminals of the power supply to the LED-unit.

Suitable power supplies comprise constant-current sources, voltage sources with resistors, buck-converters, boost-converters or buck-boost-converters. Examples of a power-supply are disclosed in Zukauskas, et. al., "Introduction to solid state Lighting (2002)", Chapter 7. However, a power supply may also be a simple battery or a rectified mains connection.

In a manufacturing method according to the invention, the LED-unit is rigidly coupled to the collimator. This method includes the coupling of the LED-unit to a previously formed collimator, for example by means of an inorganic glue. Further, the method includes the formation of the collimator together with the coupling to the LED-unit, for example, when the collimator is made from plastic material and is injection moulded directly onto the LED-unit.

Figure 2:
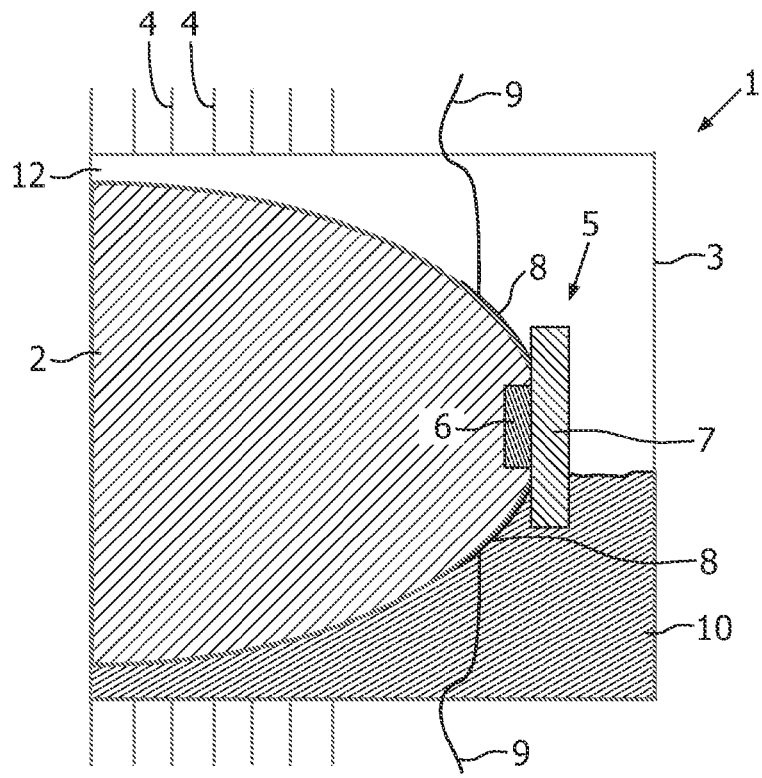
Figure 3:
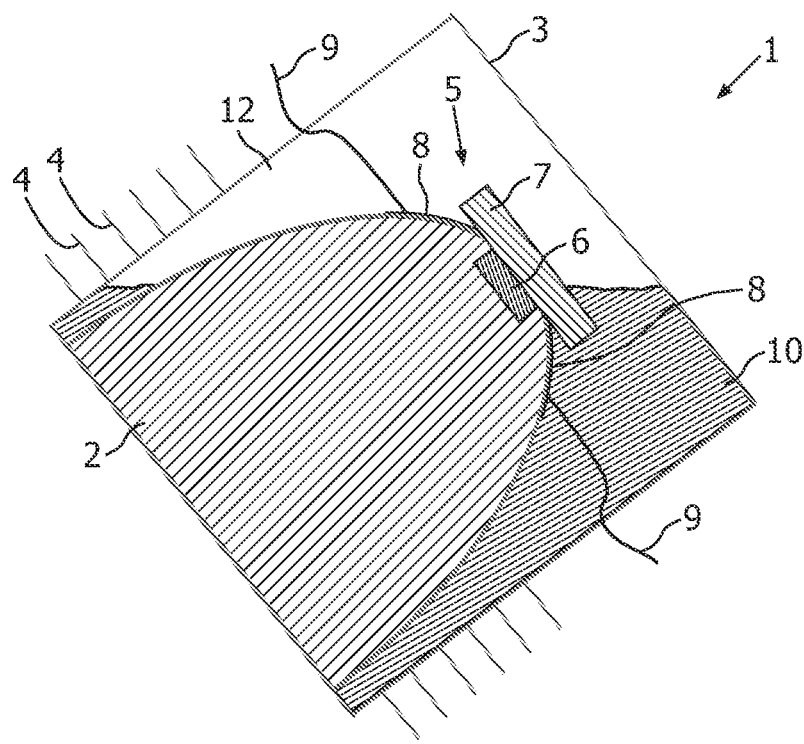
Figure 4:
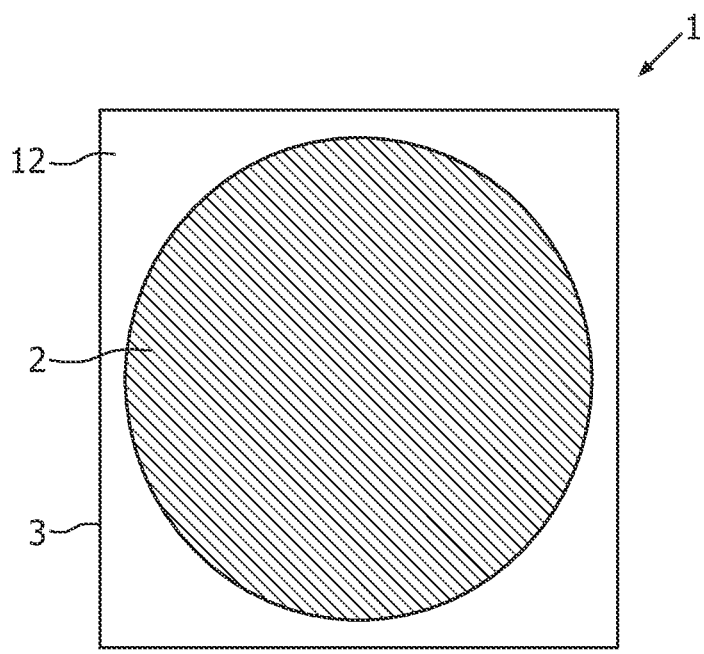
Figure 5:
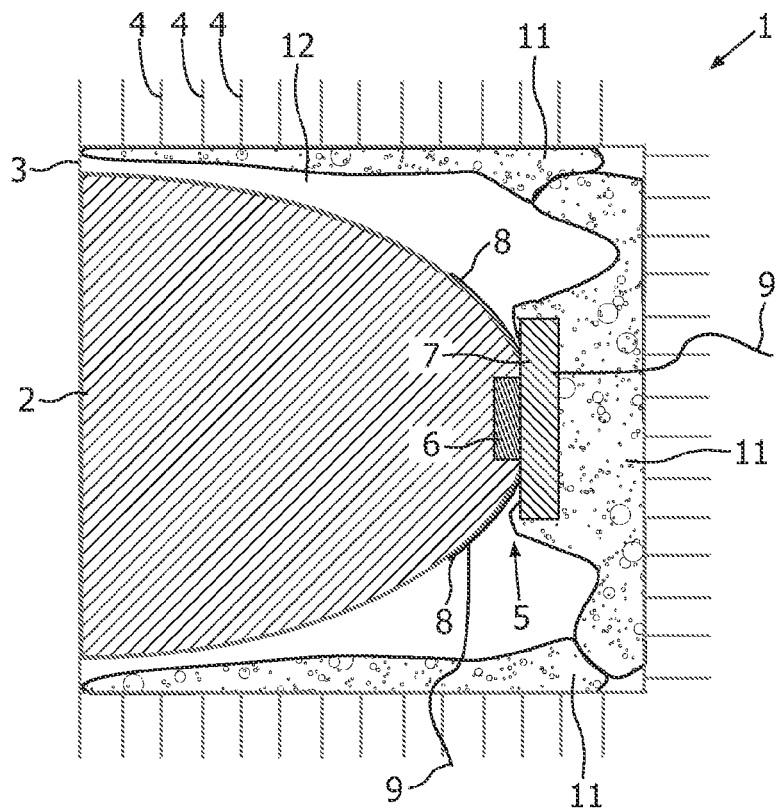
Figure 6A:
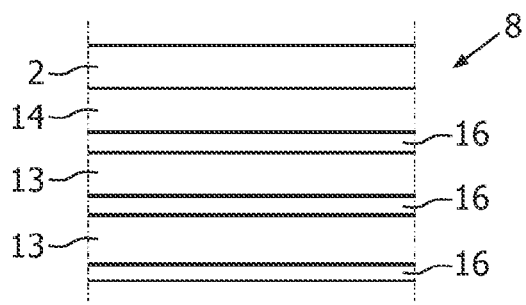
Figure 6B:
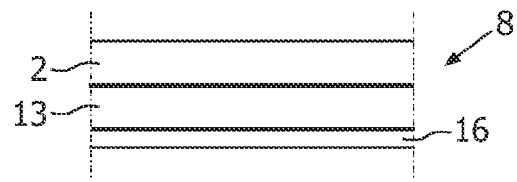
Figure 7:
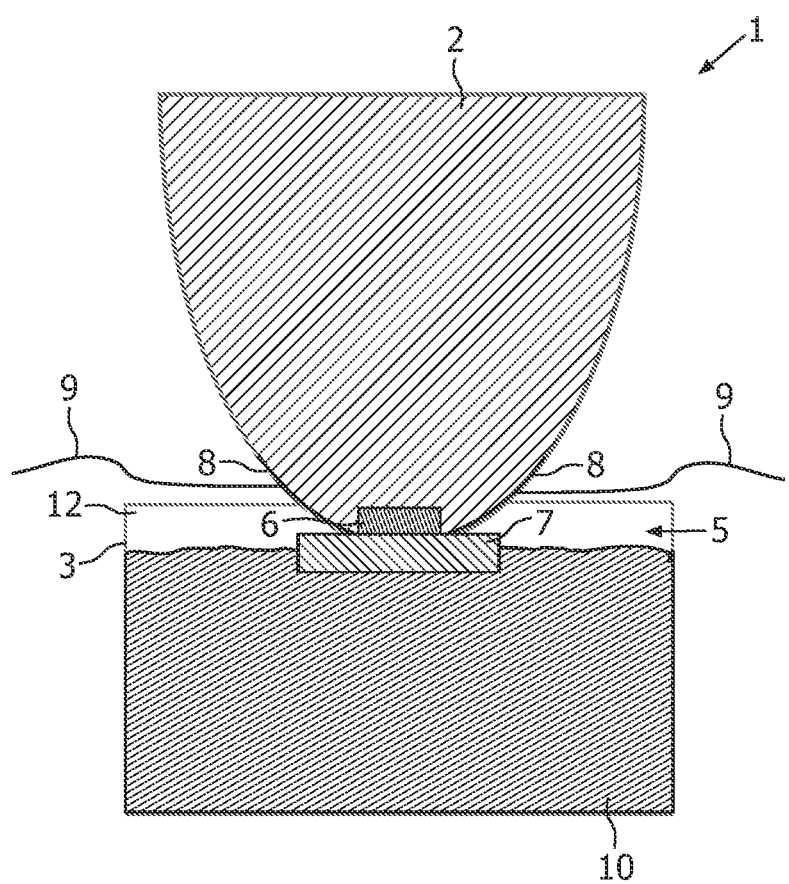
Figure 8:
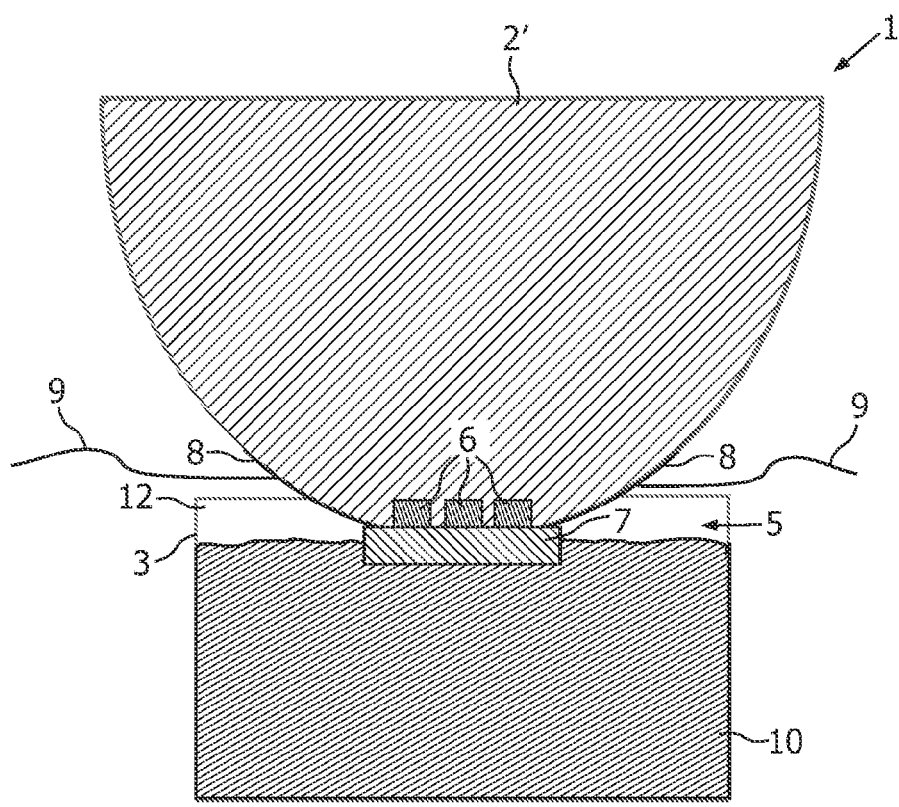
Figure 9:
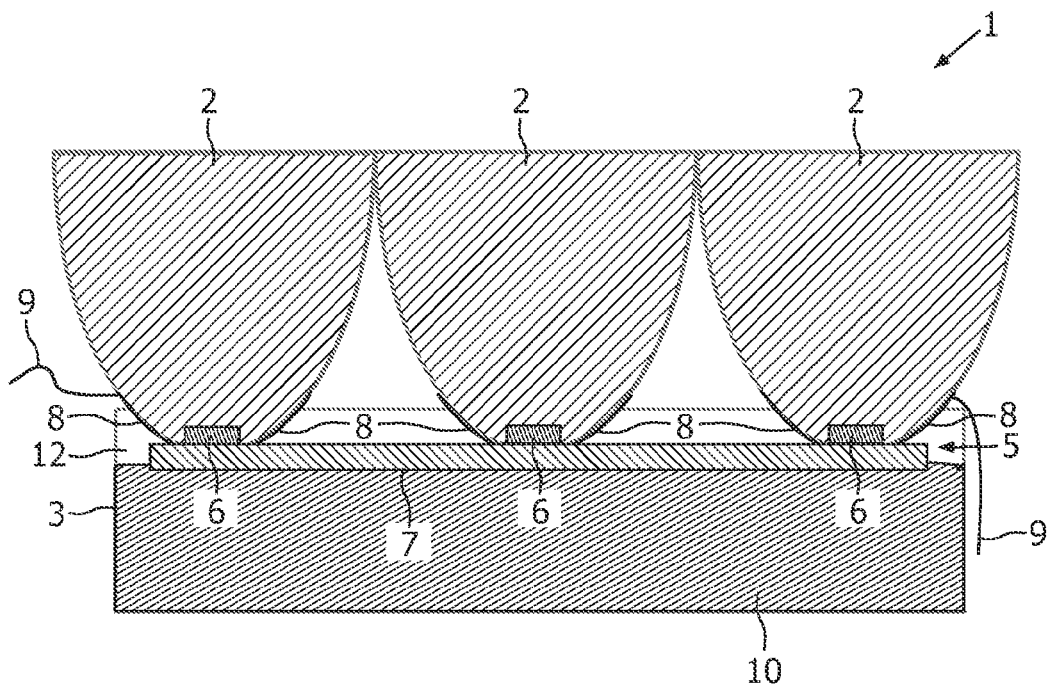

These and other aspects of the invention will be apparent from and elucidated with reference to the embodiments described hereinafter. In the figures, FIG. 1 shows a schematic sectional view of a first embodiment of a lighting device according to the invention, FIG. 2 shows a schematic sectional view of the first embodiment in a second position, FIG. 3 shows a sectional view of the first embodiment in a further position, FIG. 4 shows a sectional view along line A-A' of the embodiment shown in FIG. 1, FIG. 5 shows a sectional view of a second embodiment according to the invention, FIG. 6a shows a schematic diagram of a first example of a layer structure, FIG. 6b shows a schematic diagram of another example of a layer structure, FIG. 7 shows a schematic diagram of a third embodiment according to the invention, FIG. 8 shows a schematic diagram of a fourth embodiment according to the invention and FIG. 9 shows a schematic diagram of a fifth embodiment according to the invention.

Referring to the figures, FIG. 1 shows a schematic section side view of lighting device 1 according to a first embodiment of the invention. Here, a TIR collimator 2, made from PMMA (polymethyl methacrylate), is mounted in a housing 3. The light-emitting front surface of the collimator 2 is mounted to the upper part of the housing 3 using an epoxy glue, so that housing 3 and collimator 2 form a sealed cavity 12, which extends around the collimator 2. The housing comprises several head fins 4, to dissipate heat generated in the lighting device 1. An LED-unit 5, comprising an LED-die 6 and a heat spreader 7, is rigidly connected to the lower part of the collimator 2. To establish the rigid connection, the collimator 2, made from polymer PMMA material, is injection moulded directly onto the LED-unit 5. Since the PMMA raw-material of the collimator 2 is fluid when applied to the LED-unit 5, a perfect form-fit is achieved. Thus, no air-gap is present in the optical path, which results in high optical efficacy due to reduced coupling-losses.

The LED-die 6 comprises several electrical circuits for driving the LED. The LED-die 6 is electrically connected to a power supply (not shown) using conductive layers 13, provided in a layer structure 8, which is provided on parts of the surface of the collimator 2. The remaining parts of the surfaces of the collimator 2, except for the light-emitting front surface, are covered with a cladding (not shown), so that total internal reflection properties are always maintained, when the collimator 2 is in direct contact with a heat-pipe fluid 10, provided in the cavity 12. Here, ethanol is used as heat-pipe fluid 10.

The conductive layers 13 are connected to wires 9, which connect to a power supply. Embodiments of the configuration of the layer structure 8 are shown in FIGS. 6a and 6b and are explained below. The heat spreader 7 is made from DBC (Direct Bonded Copper) and is used to enhance the thermal contact to the heat pipe fluid 10, provided in the cavity 12, in which the LED-unit 5 is partly immersed.

To achieve transportation of heat generated by the LED-die 6 in operation to the outside of the housing 3, heat pipe fluid 10 is heated and evaporated by the LED-unit 5. The hot vapor of the heat pipe fluid 10 condenses at the cold walls of the housing 3 and/or the collimator 2 and then flows back to the reservoir of heat-pipe fluid 10, surrounding the LED-unit. Using this mechanism, a steady circular flow is maintained.

The cavity 12 of the housing 3 is designed so that the LED-unit 5 is at least partly immersed in the heat pipe fluid 10, independent of the operating position. A sectional view of the embodiment of FIG. 1 in a second position is shown in FIG. 2. As can be seen from the figure, the amount of heat pipe fluid 10 and the dimension of the cavity 12 is matched, so that the LED-unit 5 is at least partly immersed in the heat pipe fluid 10. To enable sufficient fluid circulation in every possible mounting position, the collimator 2 is connected to the housing 3 only at the light-emitting front surface, as depicted in FIG. 4, which shows a sectional view along a line A-A'. A return-flow of the condensed heat-pipe fluid to the reservoir 10 is thus possible in every mounting position.

FIG. 3 shows the embodiment of FIG. 1 in a third operating position. Due to the design of the cavity 12, the LED-unit 5 is again partly immersed in heat-pipe fluid 10, even when the lighting device 1 is slightly tilted. Although not shown, for enhanced cooling of the housing 3, it may be advantageous to arrange a higher number of heat fins 4, circumferential on the outside of the housing 3, as shown in FIG. 5.

Alternatively to the above-mentioned, it is also possible to use a convection-type heat transferring medium instead of the heat-pipe fluid 5. In this case, heat fins 4 should be provided at the place, where the hot fluid is in contact with the housing 3.

FIG. 5 shows a second embodiment of a lighting device 10 according to the invention. In comparison to the first embodiment, shown in FIG. 1, a porous material 11 is arranged inside of the cavity 12.

The porous medium 11 comprises fibrous structures, to enhance the circulation of the heat pipe fluid 10. Here, heat-pipe fluid 5, contained in the porous medium 11 surrounding the LED-unit 5 partly, is evaporated due to the heat, generated in the LED-unit 5. As explained above, the hot vapor condenses at the walls of the housing 3 and/or the solid collimator 2. The condensed fluid is then at least partly absorbed by the porous medium 11 and fed to the LED-unit 5. The porous medium 11 therefore includes small fibrous structures, so that capillary forces, originating from a gradient in fluid concentration, result in the conduction of the condensed fluid to the LED-unit 5.

FIG. 6a depicts a schematic diagram of a first example of a layer structure 8, formed on the surface of the collimator 2. This layer configuration is used in the embodiment, shown in FIG. 1. The layer structure includes a reflective coating 14, formed directly on the surface of the collimator 2. Due to the fact, that the angle of incident light on the inner surface of the TIR collimator 2 is high in the area, near the LED-unit 5, it is difficult to achieve total internal reflection properties. The reflective coating 14 thus enhances the optical efficacy of the lighting device 1. On the reflective coating 14, two electrically conductive layers 13 are formed, separated from each other and from the reflective coating 14 by isolating lacquer 16. The outermost conductive layer 13 is also covered with isolation lacquer 16, to isolate the conductive layer 13 against the inside of the cavity 12 and the heat-pipe fluid 10, accordingly. The conductive layers 13 connect the electrical terminals of the LED-die 5 to the wires 9. Although two stacked conductive layers 13 are shown here, it may be possible to form two conductive structures, electrically isolated from each other in a single layer. Conductive layers 13 and the reflective layer 14 consist of aluminium, formed in a vacuum deposition process. Although aluminium is used in this embodiment, other conducting metal-materials or alloys may be used for the formation of the conductive layers 13. The material for the reflective coating 14 may be chosen dependent of the wavelength range of the lighting device 1. Lacquer layers 16 are formed from standard types of lacquer used to accommodate metal (or other conductive material) deposition.

FIG. 6b shows a schematic diagram of another example of a layer structure 8. The example shown here depicts a simpler configuration of a layer structure 8. Here, a single conductive layer 13 is formed on the surface of the collimator 2. The conductive layer 13 is formed from aluminium and also serves as a reflective coating, as described above. The conductive layer 13 is covered with a lacquer 16 to isolate the layer against the inside of the cavity 12. Since here only one conductive structure, namely the conductive layer 13, is present in the layer structure 8, only one electrical terminal of the LED-die 6 can be connected to the power supply via the layer structure 8. The other electrical terminal of the LED-die 6 may be connected directly to the power supply, using a wire 9, as exemplary shown in the embodiment of FIG. 5. Alternatively, the other electrical terminal of the LED-die 6 may be connected using the heat-pipe fluid 10, as explained above. In this case, the heat-pipe fluid 10 should provide a good electrical conductance. The LED-unit 5 and the housing 3 should provide electrical terminals to connect to the heat-pipe fluid 10.

FIG. 7 shows a schematic side view of a third embodiment of a lighting device 1. Here, the collimator 2 is mounted partly in the housing 3, so that the LED-unit 5 is arranged in the cavity 12 and thus in direct contact with the heat-pipe fluid 10. Thereby, a cladding on the surfaces of the collimator 2, as before-mentioned, is advantageously not necessary, since the part of the surface, which may come into contact with the heat-pipe fluid 10 is covered by the layer structure 8.

FIG. 8 and FIG. 9 show further embodiments of a lighting device 1. The fourth embodiment, shown in FIG. 8, exhibits three LED-dice 6 on the LED-unit 5. A single collimator 2' is adapted to the arrangement of the LED-dice 6. It is thus possible to achieve higher levels of luminous flux. The fifth embodiment, shown in FIG. 9, shows a similar setup to the one shown in FIG. 8. FIG. 9 shows three collimators 2 together with respective LED-dice 6 on a common heat spreader 7. The arrangement allows an easy adaptability of the lighting device 1. Although not shown, it is easily possible to up/downscale the number of LEDs used, depending on application. For example, when RGB colour mixing is required, a number of three coloured LEDs may be advantageous.

The embodiments described herein are intended in an illustrative rather than a limiting sense. The use of any reference signs in the claims shall not limit the scope of the respective claim.

The invention claimed is:

1. A lighting device comprising
   an LED-unit that includes an LED-die mounted on a heat spreader,
   a collimator, that is mounted at least partly in a housing, and
   a non-rigid heat transferring medium, contained in a cavity in the housing, wherein:
   the LED-unit is rigidly coupled to the collimator only and the heat spreader is at least partly contained in the heat transferring medium to dissipate heat generated by the LED-unit;
   the collimator has a lower surface for receiving light from the LED-unit and an upper surface from which collimated light is emitted; and
   the LED die has a light emitting surface that is in direct contact with the lower surface of the collimator.

2. The device of claim 1, wherein the collimator is a TIR collimator.

3. The device of claim 1, wherein the LED-unit is coupled to the collimator by means of inorganic glue, glass frits or by injection molding.

4. The device of claim 1, wherein the heat transferring medium is gel-like or liquid.

5. The device of claim 4, wherein the cavity is dimensioned so that the LED-unit is at least partly contained in the liquid heat transferring medium, independent of the mounting position of the lighting device.

6. The device of claim 4, wherein the liquid heat transferring medium is a heat-pipe fluid.

7. The device of claim 1, wherein the cavity comprises porous, fibrous or wick-like structures.

8. The device of claim 1, wherein the collimator comprises at least one conductive layer connected to the LED-unit, designed to connect the LED-unit to a power supply.

9. A lighting system that comprises a lighting device according to claim 1 and a power supply unit that is connected to the LED-unit.

10. A manufacturing method for a lighting device in which a surface of a collimator is rigidly coupled to a light-emitting surface of an LED-die that is mounted on a heat spreader, the collimator is mounted at least partly in a housing and a non-rigid heat transferring medium is fed into a cavity which is provided in the housing, so that the heat spreader is at least partly contained in the heat transferring medium.

11. A method comprising:
    providing a collimator having a lower surface and an upper surface;
    providing an LED-unit having a heat spreader upon which is mounted an LED-die with a light emitting surface;
    situating the light emitting surface to be in direct contact with the lower surface of the collimator;
    mounting the collimator with attached LED-unit in a housing; and
    feeding a non-rigid heat transferring medium into a cavity of the housing, so that the LED-unit is at least partly contained in the medium.

12. The method of claim 11, wherein the heat spreader includes at least one of direct bonded copper, ceramics, silicon, or metal material.

13. The method of claim 11, wherein attaching the light emitting surface to the lower surface of the collimator includes molding the collimator upon the LED-unit.

14. The method of claim 11, wherein attaching the light emitting surface to the lower surface of the collimator includes applying heat and pressure to glass frites disposed between the collimator and the LED-unit.

15. The method of claim 11, wherein attaching the light emitting surface to the lower surface of the collimator includes applying inorganic glue between the collimator and the LED-unit.

16. The method of claim 11, including providing a reflective coating to the collimator in a part of the collimator in vicinity of where the LED-unit is attached.

17. The device of claim 1, wherein the collimator includes a GRIN lens.

18. The device of claim 1, wherein the housing includes one or more heat dissipation elements.

19. The device of claim 1, wherein one or more other LED-dies are mounted on the heat spreader, each having a light emitting surface that is in direct contact with the lower surface of the collimator.

20. The method of claim 11, wherein one or more other LED-dies are mounted on the heat spreader, each having a light emitting surface that is in direct contact with the lower surface of the collimator.

* * * * *